(12) United States Patent
Zeller (10) Patent No.: US 8,154,332 B2
(45) Date of Patent: Apr. 10, 2012

(54) CURRENT-CONTROLLED RESISTOR

(75) Inventor: Sebastian Zeller, Grassbrunn (DE)

(73) Assignee: STMicroelectronics Design and Application GmbH, Grassbrunn (DE)

( * ) Notice: Subject to any disclaimer, the term of this patent is extended or adjusted under 35 U.S.C. 154(b) by 0 days.

(21) Appl. No.: 12/610,109

(22) Filed: Oct. 30, 2009

(65) Prior Publication Data
US 2011/0102063 A1    May 5, 2011

(51) Int. Cl.
*H03L 5/00*    (2006.01)

(52) U.S. Cl. .......................... 327/308; 327/540

(58) Field of Classification Search .................. 327/306, 327/308, 538–541; 333/81 R
See application file for complete search history.

(56) References Cited

U.S. PATENT DOCUMENTS

| | | | | |
|---|---|---|---|---|
| 4,038,607 A | * | 7/1977 | Schade, Jr. ...................... 330/264 |
| 4,573,036 A | * | 2/1986 | Wondra .......................... 341/135 |
| 4,728,821 A | * | 3/1988 | Yang et al. ..................... 326/115 |
| 5,128,556 A | * | 7/1992 | Hirakata ........................ 326/115 |
| 6,897,714 B2 | * | 5/2005 | Mori ............................. 327/541 |
| 2008/0136769 A1 | * | 6/2008 | Kim et al. ...................... 345/102 |

* cited by examiner

*Primary Examiner* — Dinh T. Le
(74) *Attorney, Agent, or Firm* — Seed IP Law Group PLLC (57) ABSTRACT

A current-controlled resistor comprises a first input terminal configured to receive an input signal and a second input terminal configured to receive a current control signal. The resistor comprises a first stage configured to receive the current control signal; the first stage includes first and second PN diodes having first terminals of a first type and second terminals of a second type. The first terminals of the first and second PN diodes are coupled each other and a second terminal of the first PN diode is coupled to the first input terminal. The resistor comprises a second stage configured to receive the current control signal; the second stage includes a third PN diode having first and second terminals of the first and second types, the second terminal of the third PN diode being coupled to the second terminal of the second PN diode.

23 Claims, 5 Drawing Sheets

CURRENT-CONTROLLED RESISTOR

BACKGROUND

1. Technical Field

The present disclosure relates to the electronic field. More in particular, the disclosure concerns a current-controlled resistor.

2. Description of the Related Art

An attenuator is an electronic device commonly used in wireless applications at high frequencies, for example at radio-frequencies (RF) or microwaves (more in general a frequency in the range between 10 Mhz and 2 Ghz); the attenuation of the attenuator is variable in order to control automatically the voltage level of a high-frequency input signal.

It is known that forward biased Positive-Intrinsic-Negative (PIN) diodes are used in the design of radio-frequencies or microwaves attenuators having a variable attenuation, wherein at least one PIN diode is used for controlling automatically the voltage level of an input RF signal. In fact, at high frequencies a PIN diode is equivalent to a current-controlled resistor, that is, it operates as a variable resistor having a resistance value controlled by the forward bias current flowing in the PIN diode, the resistance value being inversely proportional to the forward bias current; for example, the minimum resistance value of the PIN diode is 10 Ohm and the maximum resistance value is 1500 Ohm.

Figure 1:
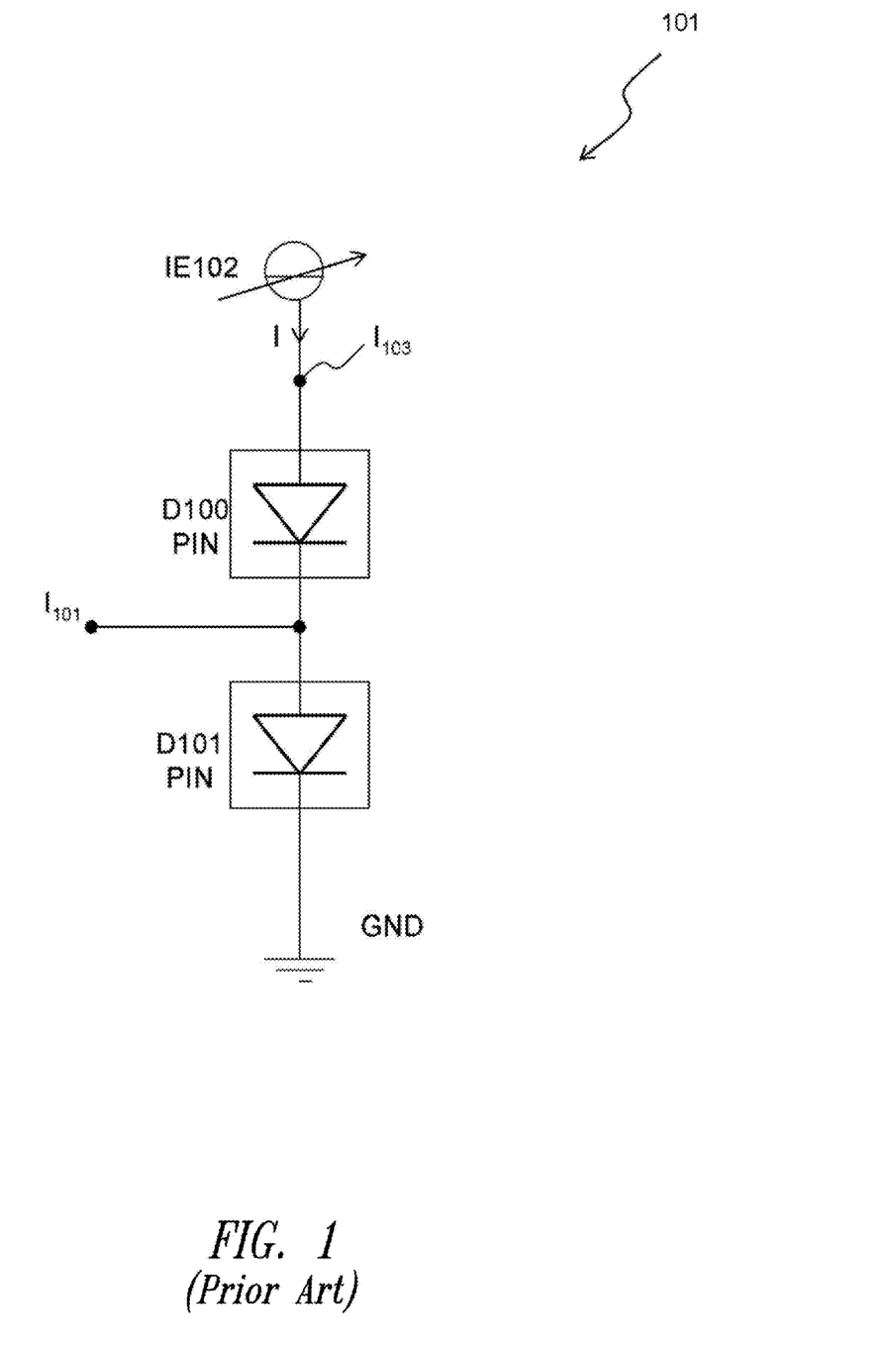
FIG. 1 schematically shows a current-controlled resistor according to the prior art.

FIG. 1 shows a current-controlled resistor 1 according to the prior art. The current-controlled resistor 1 comprises:

an input terminal $I_{101}$ for receiving a RF input signal;

a control input terminal $I_{103}$ for receiving from a current source IE102 a variable bias control current I for controlling the small signal resistance value between the input terminal $I_{101}$ and ground and between the input terminal $I_{101}$ and the control input terminal $I_{103}$;

a series connection of two forward biased PIN diodes D100, D101 connected between the current source IE102 and ground GND (PIN diodes D100, D101 are enclosed in FIG. 1 by a square for distinguishing with respect to a PN diode).

The series connection of the two forward biased PIN diodes D100, D101 implement two variable resistors, each one having a variable resistance value controlled by the bias control current I.

The current-controlled resistors according to the prior art have the disadvantage to require the use of at least one PIN diode, which is a device which can't be simply implemented into an integrated circuit, because additional process steps are necessary for the formation of the intrinsic layer of the PIN diode in standard technologies (such as Bipolar, CMOS or BiCMOS technologies).

BRIEF SUMMARY

According to a first aspect, the present disclosure provides a current-controlled resistor comprising a first input terminal configured to receive an input signal and comprising a second input terminal configured to receive a current control signal. The current-controlled resistor comprises a first stage configured to receive at least part of the current control signal; the first stage includes first and second PN diodes having respective first terminals of a first type and respective second terminals of a second type, wherein the first terminals of the first and second PN diodes are coupled each other and wherein a second terminal of the first PN diode is coupled to the first input terminal. The current-controlled resistor further comprises a second stage configured to receive at least part of the current control signal; the second stage includes a third PN diode having first and second terminals of the first and second types, respectively, the second terminal of the third PN diode being coupled to the second terminal of the second PN diode of the first stage.

Preferably, the current-controlled resistor includes a first current mirror interposed between the second input terminal and the first terminals of the first, second and third PN diodes; the first current mirror is configured to transmit part of the current control signal to the first stage and part to the second stage.

Preferably, the first terminals of the first and second PN diodes are anodes coupled each other and to the first current mirror, the second terminal of the first PN diode is a cathode coupled to the first input terminal, the first terminal of the third PN diode is an anode coupled to the first current mirror, the second terminal of the second PN diode is a cathode and the second terminal of the third PN diode is a cathode coupled to the cathode of the second PN diode.

Preferably, the first stage includes fourth and fifth PN diodes. The anode of the fourth PN diode is coupled to the first input terminal and to the cathode of the first PN diode and the anode of the fifth PN diode is coupled to the cathode of the second PN diode. The cathode of the fourth PN diode is coupled to the cathode of the fifth PN diode. The second stage includes a sixth PN diode having an anode coupled to the cathode of the third PN diode and coupled to the anode of the fifth PN diode. The current-controlled resistor includes a second current mirror coupled to a cathode of the sixth PN diode and coupled to the cathodes of the fourth and fifth PN diodes.

According to a second aspect, the present disclosure provides an electronic receiver including an amplifier configured to receive an input signal and to generate therefrom an amplified signal and a current control signal. The electronic receiver further includes a current-controlled resistor comprising a first input terminal configured to receive the input signal and comprising a second input terminal configured to receive the current control signal. The current-controlled resistor comprises a first stage configured to receive at least part of the current control signal; the first stage includes first and second PN diodes having respective first terminals of a first type and respective second terminals of a second type, wherein the first terminals of the first and second PN diodes are coupled each other and wherein a second terminal of the first PN diode is coupled to the first input terminal. The current-controlled resistor further comprises a second stage configured to receive at least part of the current control signal; the second stage includes a third PN diode having first and second terminals of the first and second types, respectively, the second terminal of the third PN diode being coupled to the second terminal of the second PN diode of the first stage.

Preferably, the amplifier is configured to change the value of the current control signal to keep the voltage level of the input signal within a range of values.

Preferably, the amplifier is configured to change its gain value to maintain the amplified signal level smaller or equal than a value.

The Applicant has recognized that the current-controlled resistor according to the present disclosure has the advantage that it can be implemented into an integrated circuit in standard bipolar or BiCMOS technologies, keeping at the same time electric properties (conductance, linearity, noise) which are substantially equivalent to current-controlled resistors implemented by PIN diodes.

DETAILED DESCRIPTION

Figure 2:
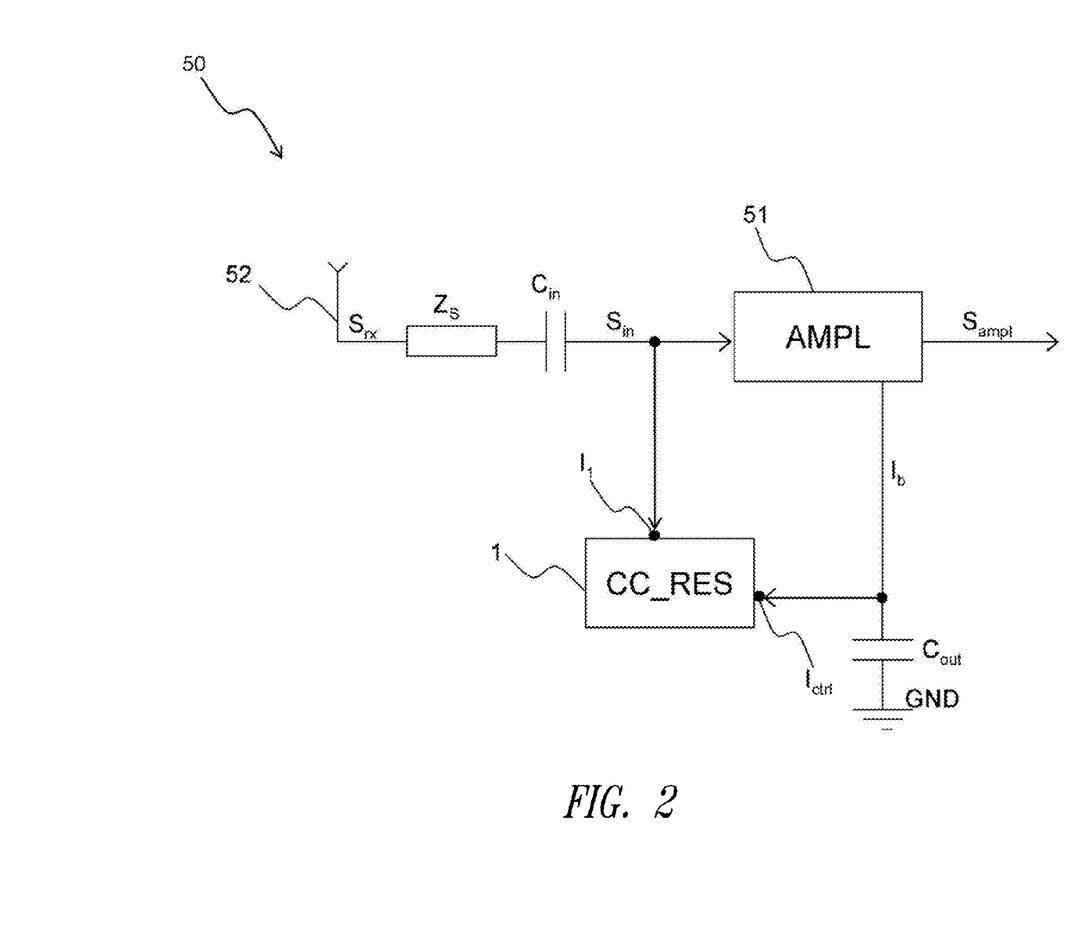
FIG. 2 schematically shows an electronic receiver according to the present disclosure.

Referring to FIG. 2, it shows an electronic receiver 50 according to the present disclosure.

The electronic receiver 50 includes a RF amplifier 51, a current-controlled resistor 1, an input capacitor $C_{in}$ and a decoupling capacitor $C_{out}$. At RF frequencies typically employed for communications, for example 10 Mhz-2 Ghz, both the input capacitor $C_{in}$ and the decoupling capacitor $C_{out}$ are substantially equivalent to a short circuit.

FIG. 2 further shows an antenna 52 for receiving a RF received signal $S_{rx}$ from a communication channel and shows a source impedance $Z_s$ which is the direct or transformed impedance of the antenna 52.

The RF amplifier 51 includes an input terminal for receiving an RF input signal $S_{in}$, a first output terminal for generating an amplified signal $S_{amp}$, obtained by amplification of the radio-frequency signal $S_{in}$, and a second output terminal for generating a variable current control signal $I_b$.

The current-controlled resistor 1 includes a first input terminal $I_1$ for receiving the RF input signal $S_{in}$ and includes a second input terminal $I_{ctrl}$ for receiving the variable current control signal $I_b$.

The operation of the RF amplifier 51 is such to change the value of the current control signal $I_b$ provided to the current-controlled resistor 1 in order to control the RF input signal $S_{in}$, for example by keeping the voltage level of the RF input signal $S_{in}$ within a range of values: in this example, the RF amplifier 51 and the current-controlled resistor 1 are such to operate as an automatic gain controlled (AGC) loop, wherein the gain control is achieved by a voltage divider which is composed of the impedance $Z_s$ and of the current-controlled resistor 1 having a small signal resistance $r_1$ between the first input terminal $I_1$ and ground.

It will be described hereinafter the operation of the electronic receiver 50.

It is supposed that for RF communication frequencies both the input capacitor $C_{in}$ and the output capacitor $C_{out}$ are equivalent to a short circuit. It is also supposed that the RF amplifier 51 generates the current control signal $I_b$ having a direct current value The antenna 52 receives from the communication channel a RF received signal $S_{rx}$, which generates a voltage at the terminal of the source impedance $Z_s$. It is supposed that the input impedance of the RF amplifier 51 is high with respect to the impedance $Z_1$ of the current-controlled resistor 1: in this case, the RF input signal $S_{in}$ is a voltage signal which is calculated by the voltage divider composed of the impedance $Z_s$ and of the current-controlled resistor 1 having the small signal resistance $r_1$ between the first input terminal $I_1$ and ground. Therefore the RF input voltage signal $S_{in}$ is calculated according to the following formula: $S_{in}=S_{rx}*r_1/(Z_s+r_1)$ The RF amplifier 51 receives the RF input voltage signal $S_{in}$ and generates the amplified signal $S_{ampl}$ which is a voltage signal obtained by amplification of the RF input voltage signal $S_{in}$ according to the actual gain value of the RF amplifier 51.

Moreover, the RF amplifier 51 receives the RF input voltage signal $S_{in}$, detects that the value of the RF input voltage signal $S_{in}$ is outside the ranges of values and generates the current control signal $I_b$ having a current value $i_{b2}$ which has a small variation with respect to the direct current value $I_{b1}$.

The current-controlled resistor 1 receives at the second input terminal $I_{ctrl}$ the current control signal $I_b$ having the current value $i_{b2}$, which modifies the small signal resistance between the first input terminal $I_1$ and ground of the current-controlled resistor 1 from the value $r_1$ to the value $r_1'$; therefore the RF input voltage signal $S_{in}$ changes to the following value: $S_{in}'=S_{rx}*r_1'/(Z_s+r_1')$ The RF amplifier 51 receives the RF input voltage signal $S_{in}'$ and detects that the value of the RF input voltage signal $S_{in}'$ is within the ranges of values: the RF amplifier 51 keeps the actual value $i_{b2}$ of the current control signal $I_b$ until the RF amplifier 51 detects that the RF input voltage signal $S_{in}$ changes to a new value $S_{in}''$ which is outside the range of values.

Advantageously, the gain of the RF amplifier 51 is controlled by an automatic gain controlled loop including an AGC RF amplifier 51 and the current-controlled resistor 1: this allows to extend the range of the RF received signal $S_{rx}$ for which the automatic gain controlled amplifier 51 can maintain a defined maximum signal level of the amplified signal $S_{ampl}$.

Figure 3:
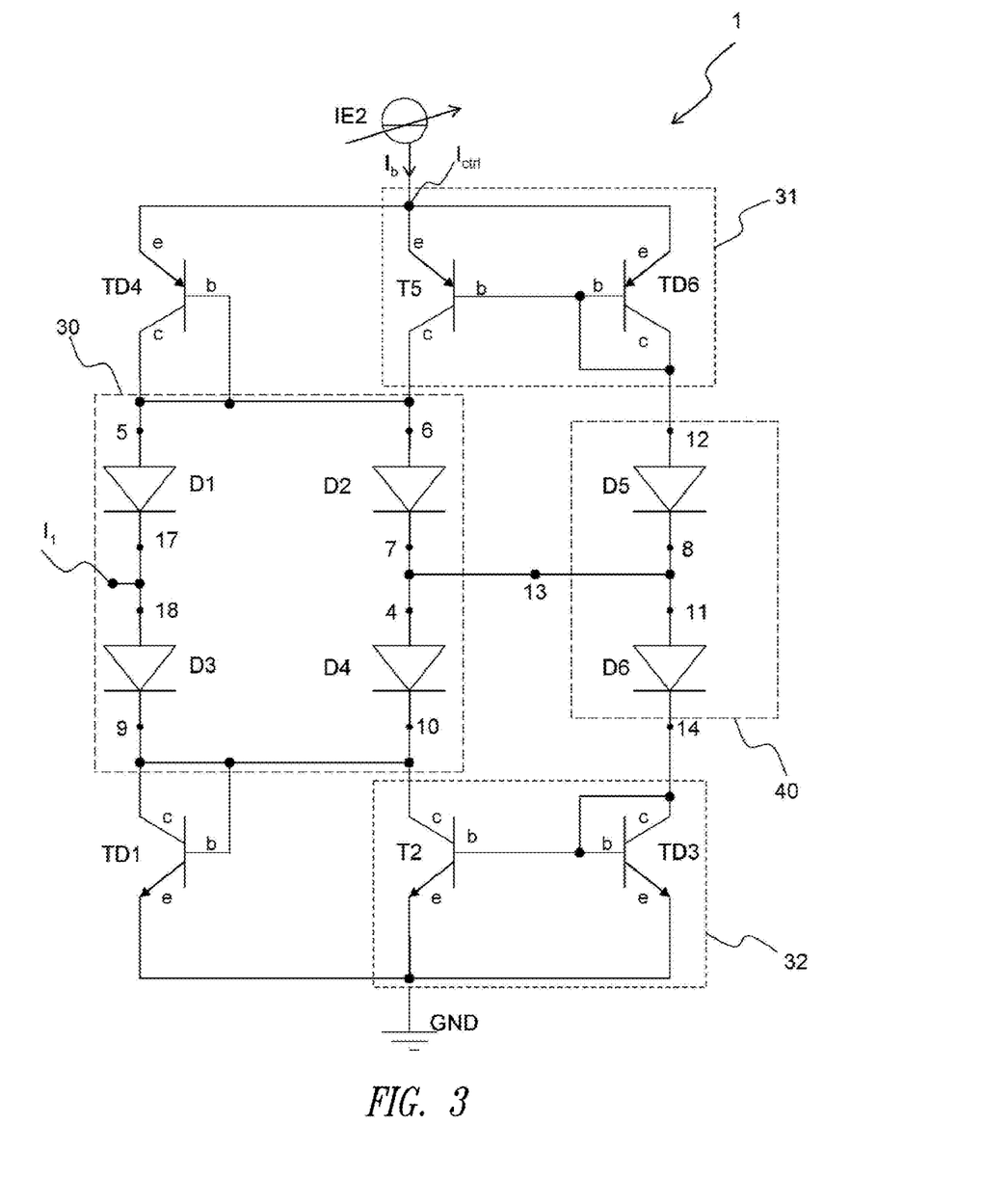
FIG. 3 schematically shows a current-controlled resistor according to the present disclosure.

Referring to FIG. 3, it shows more in detail the current-controlled resistor 1 of FIG. 2.

The current-controlled resistor 1 includes:
the first input terminal for receiving an input signal;
the second input terminal $I_{ctrl}$ for receiving a variable current control signal $I_b$;
a first stage 30;
a second stage 40 connected to the first stage 30 into the node 13;
a first current mirror 31.

The first stage 30 includes a first PN diode D1 and a second PN diode D2; the anode 5 of the first PN diode D1 is connected to the anode 6 of the second PN diode D2 and the anodes 5, 6 are connected to the first current mirror 31.

The first current mirror 31 is interposed between the second input terminal $I_{ctrl}$ and the anodes 5, 6 of the first and second PN diodes D1, D2 of the first stage 30 and is interposed between the second input terminal $I_{ctrl}$ and the second stage 40. The first current mirror is such to transmit part of the current control signal $I_b$ to the first stage 30 and part to the second stage 40.

The cathode 17 of the first PN diode D1 is connected to the first input terminal $I_1$.

The second stage 40 includes a PN diode D5 having the anode 12 connected to the first current mirror 31 and having the cathode 8 connected to the cathode 7 of the second PN diode D2.

Preferably, the first stage 30 further includes a third PN diode D3 having the anode 18 connected to the cathode 17 of the first PN diode and includes a fourth PN diode D4 having the anode 4 connected to the cathode 7 of the second PN diode D2; moreover, the cathode 9 of the third PN diode D3 is connected to the cathode 10 of the fourth PN diode D4. The second stage 40 further includes another PN diode D6 having the anode 11 connected to the cathode 8 of the PN diode D5.

Preferably, the current-controlled resistor 1 further includes a second current mirror 32 interposed between the third and fourth diodes D3, D4 of the first stage 30 and ground and is interposed between the other PN diode D6 of the second stage 40 and ground. Specifically, the second current mirror 32 is connected from one side to the cathodes 9, 10 of the third and fourth diodes D3, D4 of the first stage 30 and to the cathode 14 of the other PN diode D6 of the second stage 40 and is connected from another side to ground.

The group of devices including the first current mirror 31, the first PN diode D1, the second PN diode D2 and the PN diode D5 of the second stage performs the function of a first variable resistor between the first input terminal $I_1$ and the second input terminal $I_{ctrl}$, wherein the resistance value of the first variable resistor is controlled by the bias current $I_b$ received at the second input terminal $I_{ctrl}$.

The group of devices including the third PN diode D3, the fourth PN diode D4, the PN diode D6 of the second stage and the second current mirror 32 performs the function of a second variable resistor between the first input terminal $I_1$ and ground, wherein the resistance value of the second variable resistor is controlled by the bias current $I_b$ received at the second input terminal $I_{ctrl}$.

Preferably, the current-controlled resistor 1 further includes a diode TD4 connected between the second input terminal $I_{ctrl}$ and the anodes 5, 6 of the first and second PN diodes D1, D2. Advantageously, the diode TD4 is a trans-diode implemented with a pnp (positive-negative-positive) BJT (Bipolar Junction Transistor) having the base terminal b connected to the collector terminal c with a short circuit, having the emitter terminal e connected to the second input terminal $I_{ctrl}$ and having the collector terminal c connected to the anodes 5, 6 of the first and second PN diodes D1, D2 respectively. The trans-diode TD4 has the advantage to improve the linearity of the conductance of the current-controlled resistor 1 as a function of the current control signal $I_b$, as it will be explained more in detail afterwards.

Preferably, the current-controlled resistor 1 further includes another diode TD1 connected between the anodes 9, 10 of the third and fourth PN diodes D3, D4 and ground. Advantageously, the diode TD1 is a trans-diode implemented with a npn (negative-positive-negative) BJT having the base terminal b connected to the collector terminal c with a short circuit, having the emitter terminal e connected to ground and having the collector terminal c connected to the cathodes 9, 10 of the third and fourth PN diodes D3, D4 respectively. The trans-diode TD1 has the advantage to improve the linearity of the conductance of the current-controlled resistor 1 as a function of the current control signal $I_b$, as it will be explained more in detail afterwards.

Preferably, the current mirrors 31 and 32 are implemented with BJT. Specifically, the first current mirror 31 includes a first pnp BJT TD6 and a second pnp BJT T5; the base terminal b of the first pnp BJT TD6 is connected to the base terminal b of the second pnp BJT T5, the emitter terminals e of the first pnp BJT TD6 and of the second pnp BJT T5 are connected each other and to the second input terminal $I_{ctrl}$, the collector terminal c of the second pnp BJT T5 is connected to the anode 6 of the second PN diode and the collector terminal c of the first pnp BJT TD6 is connected to its base terminal b and to the anode 12 of the PN diode D5 of the second stage. The second current mirror 32 includes a third npn BJT TD3 and a fourth npn BJT T2; the base terminal b of the third BJT TD3 is connected to the base terminal b of the fourth npn BJT T2, the emitter terminals e of the third and fourth npn BJTs are connected each other and to ground, the collector terminal c of the fourth npn BJT T2 is connected to the anode 10 of the fourth PN diode D4 and the collector terminal c of the third npn BJT TD3 is connected to its base terminal b and to the anode 14 of said other PN diode D6 of the second stage.

Alternatively, the current mirrors 31 and 32 are implemented with MOSFET (Metal-Oxide-Semiconductor Field Effect Transistors), by replacing the pnp BJTs with p-channel MOSFETs and replacing the npn BJTs with n-channel MOSFETs.

Alternatively, the current mirrors 31 and 32 can be implemented with a circuit different from the one shown in FIG. 3.

Figure 4:
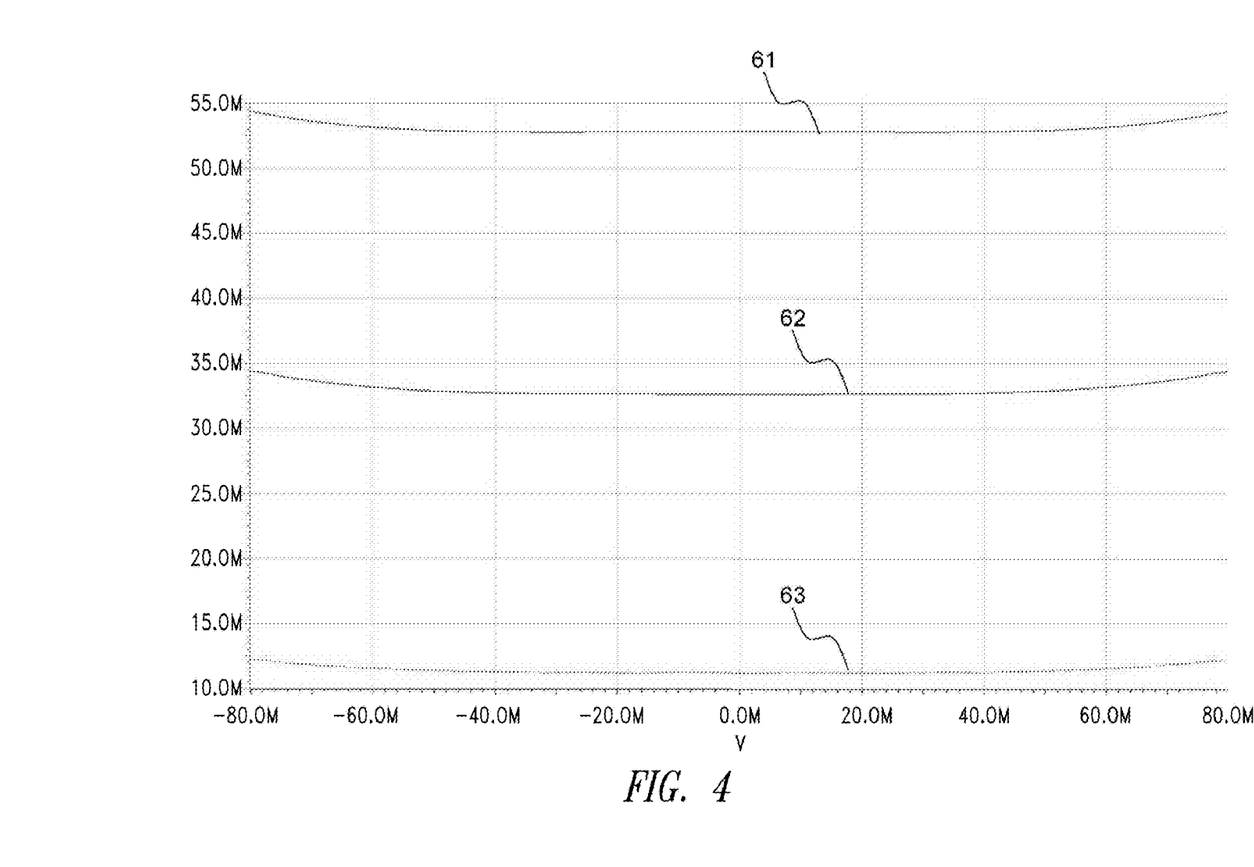
FIG. 4 schematically shows the graph of the small signal conductance of the current-controlled resistor as a function of the voltage excursion around the bias point.

It is worth noting that the current-voltage characteristic of the first stage 30 between a current signal injected into the first input terminal $I_1$ and the voltage drop between the first input terminal $I_1$ and the node 13 is substantially according to the hyperbolic tangent function, and the current-voltage characteristic of the second stage 40 between the current signal injected into the first input terminal $I_1$ and the voltage drop between the node 13 and ground is substantially according to the hyperbolic sine function. The combination of the hyperbolic tangent current-voltage characteristic with the hyperbolic sine current-voltage characteristic allows to achieve a graph of the small signal conductance of the current-controlled resistor 1 (that is, the small signal relationship between the current flowing into the first input terminal $I_1$ and a voltage signal applied to the first input terminal $I_1$ as a function of the same voltage signal) which is substantially constant over a large range of voltage values around the bias point, as shown schematically in FIG. 4 with line 61 (or with lines 62 or 63). Moreover, FIG. 4 shows three lines 61, 62, 63 of the small signal conductance corresponding to bias current $I_b$=5 mA, 3 mA, 1 mA respectively: each of the three lines 61, 62, 63 shows that the small signal conductance is substantially constant as a function of the voltage applied to the first input terminal $I_i$.

Figure 5:
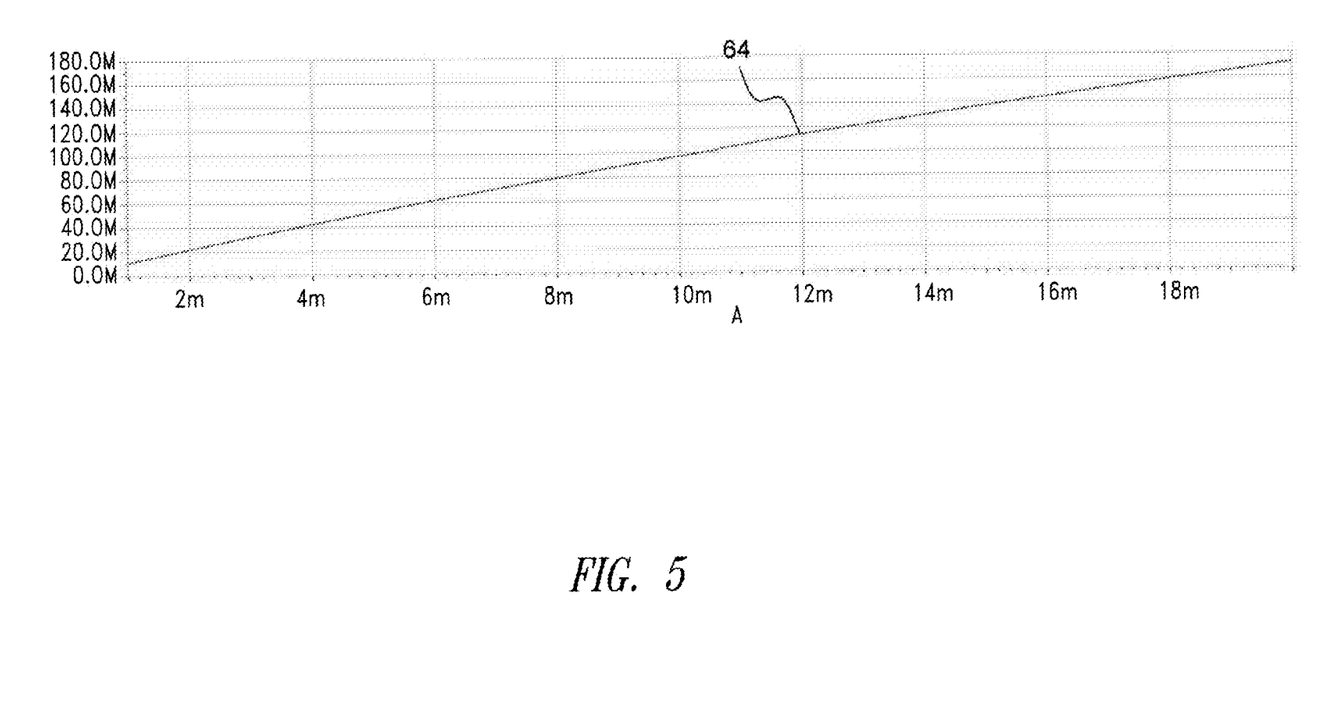
FIG. 5 schematically shows the graph of the small signal conductance of the current-controlled resistor as a function of the bias current.

Moreover, the small signal conductance of the current-controlled resistor 1 depends only on the current control signal $I_b$, that is the graph of the small signal conductance at a defined bias current $I_b$ is substantially flat as a function of the voltage applied to the first input terminal $I_1$ for a large voltage range around the bias point, while the absolute value of the small signal conductance in the flat region is proportional to the current control signal $I_b$, as shown schematically in FIG. 5 with line 64.

In one embodiment, the junction areas of the first PN diode D1, of the second PN diode D2 and of the PN diode D5 are substantially equal each other, the emitter area of the first pnp BJT TD6 is about 5 times the junction area of the trans-diode TD4 and the emitter area of the second pnp BJT T5 is about 9 times the junction area of the trans-diode TD4. These specific values allows to optimize the flatness of the graph of the small signal conductance of the current-controlled resistor 1 as a function of the voltage excursion around the bias point at the first input terminal $I_1$, because the flatness is achieved by adjusting the weight of the hyperbolic tangent current-voltage characteristic with respect to the weight of the hyperbolic sine current-voltage characteristic.

In one embodiment, the junction areas of the third PN diode D3, of the fourth PN diode D4 and of the PN diode D6 are substantially equal each other, the emitter area of the third npn BJT TD3 is about 5 times the junction area of the other trans-diode TD1 and the emitter area of the fourth npn BJT T2 is about 9 times the junction area of the other trans-diode TD1. These specific values allows to optimize the flatness of the graph of the small signal conductance of the current-controlled resistor 1 as a function of the voltage excursion around the bias point at the first input terminal $I_1$, because the flatness is achieved by adjusting the weight of the hyperbolic tangent current-voltage characteristic with respect to the weight of the hyperbolic sine current-voltage characteristic.

Preferably, the junction areas of the first, second, third, fourth PN diodes D1, D2, D3, D4 and of the PN diodes D5, D6 are substantially equal each other, the emitter areas of the trans-diodes TD4 and TD1 are equal each other, the emitter areas of the first pnp BJT TD6 and of the third npn BJT TD3 are equal each other and are about 5 times the junction area of the trans-diode TD4, and the emitter areas of the second pnp BJT T5 and of the fourth npn BJT T2 are equal each other and are about 9 times the junction area of the trans-diode TD4.

The above indicated values of the ratio between the area of the emitters and the junction area are only an example: a similar flatness of the graph of the small signal conductance can be achieved with different values of the ratio between the area of the emitters and the junctions area.

It will be described hereinafter the polarization of the electronic circuit implementing the current-controlled resistor 1.

The current-controlled resistor 1 receives at the second input terminal $I_{ctrl}$ the current control signal $I_b$ having a direct current value $I_{b1}$, which flows partly in the first current mirror 31 and partly in the trans-diode TD4. The transistors T5 and T2 are biased in the forward active region, the transistors TD1, TD3, TD4, TD6 are also biased in the forward active region (thus operating as forward biased diodes) and the diodes D1-D6 are forward biased.

It is supposed that the voltage drop at the ends of the forward biased diodes D1-D6 is 0.7 volts, that the voltage drop between base and emitter of transistors TD1, TD3, TD4, TD6 is 0.7 volts and that the voltage drop between base and emitter of transistors T2, T5 is 0.7 volts.

Therefore the voltage of nodes 9, 10, 14 is 0.7 volts, the voltage of nodes 18, 17, 4, 7, 13, 11, 8 is 1.4 volts, the voltage of nodes 5, 6, 12 is 2.1 volts and the voltage of the second input terminal $I_{ctrl}$ is 2.8 volts.

The electronic receiver 50 of the present disclosure can be implemented into a tuner for a AM/FM car radio; preferably, the tuner is implemented into an integrated circuit.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A current-controlled resistor comprising:
a first input terminal configured to receive an input signal;
a second input terminal configured to receive a current control signal;
a first stage configured to receive at least part of the current control signal, the first stage including first and second PN diodes having respective first terminals of a first type and respective second terminals of a second type, wherein the first terminals of the first and second PN diodes are coupled to each other and wherein the second terminal of the first PN diode is coupled to the first input terminal;
a second stage configured to receive at least part of the current control signal, the second stage including a third PN diode having first and second terminals of the first and second types, respectively, the second terminal of the third PN diode being coupled to the second terminal of the second PN diode of the first stage; and
a first current mirror interposed between the second input terminal and the first terminals of the first, second, and third PN diodes, the first current mirror being configured to transmit part of the current control signal to the first stage and part to the second stage.

2. A current-controlled resistor according to claim 1, wherein:
the first terminals of the first and second PN diodes are anodes coupled to each other and to the first current mirror;
the second terminal of the first PN diode is a cathode coupled to the first input terminal;
the first terminal of the third PN diode is an anode coupled to the first current mirror, the second terminal of the second PN diode is a cathode and the second terminal of the third PN diode is a cathode coupled to the cathode of the second PN diode.

3. A current-controlled resistor according to claim 2, wherein:
the first stage further includes fourth and fifth PN diodes, wherein an anode of the fourth PN diode is coupled to the first input terminal and to the cathode of the first PN diode and an anode of the fifth PN diode is coupled to the cathode of the second PN diode, and wherein a cathode of the fourth PN diode is coupled to a cathode of the fifth PN diode;
the second stage further includes a sixth PN diode having an anode coupled to the cathode of the third PN diode and coupled to the anode of the fifth PN diode;
the current-controlled resistor further includes a second current mirror coupled to a cathode of the sixth PN diode and coupled to the cathodes of the fourth and fifth PN diodes.

4. A current-controlled resistor according to claim 3, further including a first trans-diode implemented with a pnp bipolar junction transistor and coupled between the second input terminal and the anodes of the first and second PN diodes.

5. A current-controlled resistor according to claim 4, further including a second trans-diode implemented with a npn bipolar junction transistor and coupled to the cathodes of the fourth and fifth PN diodes.

6. A current-controlled resistor according to claim 5, wherein the first current mirror includes first and second pnp BJTs having respective base terminals, respective emitter terminals, and respective collector terminals, wherein:
the base terminals of the first and second pnp BJTs are coupled to each other;
the emitter terminals of the first and second pnp BJTs are coupled to each other and to the second input terminal;
the collector terminal of the second pnp BJT is coupled to the anode of the second PN diode;
the collector and base terminals of the first pnp BJT are coupled to each other and to the anode of the third PN diode; and;
the second current mirror includes first and second npn BJTs having respective base terminals, respective emitter terminals, and respective collector terminals, wherein:
the base terminals of the first and second npn BJTs are coupled to each other;
the emitter terminals of the first and second npn BJTs are coupled to each other;
the collector terminal of the second npn BJT is connected to the cathode of the fifth PN diode; and the collector and base terminals of the first npn BJT are coupled to each other and to the cathode of the sixth PN diode.

7. A current-controlled resistor according to claim 6, wherein:
the first, second, and third PN diodes have respective junction areas that are substantially equal each other;
the first pnp BJT has an emitter area that is about 5 times a junction area of the first trans-diode; and
the second pnp BJT has an emitter area that is about 9 times the junction area of the first trans-diode.

8. A current-controlled resistor according to claim 7, wherein:
the fourth, fifth, and sixth PN diodes have respective junction areas that are substantially equal each other;
the first npn BJT has an emitter area that is about 5 times a junction area of the second trans-diode;
the second npn BJT has an emitter area that is about 9 times the junction area of the second trans-diode.

9. A current-controlled resistor according to claim 1 wherein the second terminal of the second PN diode and the second terminal of the third PN diode are directly connected in common.

10. An electronic receiver comprising:
an amplifier configured to receive an input signal and to generate therefrom an amplified signal and a current control signal; and
a current-controlled resistor that includes:
a first input terminal configured to receive the input signal;
a second input terminal configured to receive the current control signal;
a first stage configured to receive at least part of the current control signal, the first stage including first and second PN diodes having respective first terminals of a first type and respective second terminals of a second type, wherein the first terminals of the first and second PN diodes are coupled to each other and wherein the second terminal of the first PN diode is coupled to the first input terminal;
a second stage configured to receive at least part of the current control signal, the second stage including a third PN diode having first and second terminals of the first and second types, respectively, the second terminal of the third PN diode being coupled to the second terminal of the second PN diode.

11. An electronic receiver according to claim 10, wherein the current-controlled resistor further includes a first current mirror interposed between the second input terminal and the first terminals of the first, second, and third PN diodes, the first current mirror being configured to transmit part of the current control signal to the first stage and part to the second stage.

12. An electronic receiver according to claim 11, wherein:
the first terminals of the first and second PN diodes are anodes coupled to each other and to the first current mirror;
the second terminal of the first PN diode is a cathode coupled to the first input terminal;
the first terminal of the third PN diode is an anode coupled to the first current mirror, the second terminal of the second PN diode is a cathode and the second terminal of the third PN diode is a cathode coupled to the cathode of the second PN diode.

13. An electronic receiver according to claim 10, wherein the amplifier is configured to change a value of the current control signal to regulate a voltage level of the input signal.

14. An electronic receiver according to claim 13, wherein the amplifier is configured to change a gain value of the amplifier to maintain a level of the amplified signal smaller than or equal to a threshold value.

15. A current-controlled resistor comprising:
a current input terminal configured to receive a control current;
a first stage configured to receive a first part of the control current, the first stage including a first PN diode having a first terminal of a first type and a second terminal of a second type; and
a second stage configured to receive a second part of the control current, the second stage including a second PN diode having first and second terminals of the first and second types, respectively, the second terminal of the second PN diode being coupled to the second terminal of the first PN diode of the first stage;
a first current mirror having a first leg interposed between the current input terminal and the first terminal of the first PN diode and a second leg interposed between the current input terminal and the first terminal of the second PN diode; and
a signal input terminal configured to receive an input signal, wherein the first stage includes a third PN diode having a first terminal of the first type and a second terminal of the second type, wherein the first terminal of the third PN diode is coupled to the first terminal of the first PN diode and the second terminal of the third PN diode is coupled to the signal input terminal.

16. A current-controlled resistor according to claim 15, further comprising:
a second current mirror coupled to a voltage reference terminal and the first and second stages, wherein:
the third PN diode is coupled between the first PN diode and a first leg of the second current mirror; and
the second stage further includes a fourth PN diode coupled between the second PN diode and a second leg of the second current mirror.

17. A current-controlled resistor comprising:
a current input terminal configured to receive a control current;
a first stage configured to receive a first part of the control current, the first stage including a first PN diode having a first terminal of a first type and a second terminal of a second type; and
a second stage configured to receive a second part of the control current, the second stage including a second PN diode having first and second terminals of the first and second types, respectively, the second terminal of the second PN diode being coupled to the second terminal of the first PN diode of the first stage;
a first current mirror having a first leg interposed between the current input terminal and the first terminal of the first PN diode and a second leg interposed between the current input terminal and the first terminal of the second PN diode;
a signal input terminal configured to receive an input signal; and
a first trans-diode, wherein the first stage includes a third PN diode having a first terminal of the first type and a second terminal of the second type, wherein the first trans-diode is coupled between the current input terminal and the first terminals of the first and third PN diodes and the third PN diode is coupled between the first trans-diode and the signal input terminal.

18. A current-controlled resistor according to claim 17, further including a second trans-diode, wherein the first stage includes a fourth PN diode having a first terminal of the first type and a second terminal of the second type, wherein the second trans-diode is coupled between a voltage reference terminal and the second terminal of the fourth PN diode and the fourth PN diode is coupled between the second trans-diode and the signal input terminal.

19. A current-controlled resistor according to claim 18, further comprising:
a second current mirror coupled between the voltage reference terminal and the first and second stages, wherein:
the first stage further includes a fifth PN diode coupled between the first PN diode and a first leg of the second current mirror; and
the second stage further includes a sixth PN diode coupled between the second PN diode and a second leg of the second current mirror.

20. A current-controlled resistor comprising:
a current input terminal configured to receive a current control signal;
a first stage configured to receive a first part of the current control signal, the first stage including:
a first diode having a first terminal of a first type and a second terminal of a second type,
a second diode having a first terminal of the first type and a second terminal of the second type, the first terminal of the second diode being coupled to the first terminal of the first diode, and
a third diode having a first terminal of the first type and a second terminal of the second type, the first terminal of the third diode being coupled to the second terminal of the second diode through an intermediate node;
a signal input terminal coupled to the intermediate node of the first stage and configured to receive an input signal; and
a second stage configured to receive a second part of the current control signal, the second stage including a fourth diode having a first terminal of the first type and a second terminal of the second type, the second terminal of the fourth diode being coupled to the second terminal of the first diode of the first stage.

21. A current-controlled resistor according to claim 20, further including:
a first trans-diode coupled between the current input terminal and the first terminals of the first and second diodes.

22. A current-controlled resistor according to claim 21, further including a second trans-diode, wherein the first stage includes a fifth diode having a first terminal of the first type and a second terminal of the second type, wherein the second trans-diode is coupled between a voltage reference terminal and the second terminal of the fifth diode, the fifth diode being coupled between the second trans-diode and the second terminal of the first diode.

23. A current-controlled resistor according to claim 21, further comprising:
a first current mirror having a first leg interposed between the current input terminal and the first terminal of the first diode and a second leg interposed between the current input terminal and the first terminal of the fourth diode;
a second current mirror coupled between a voltage reference terminal and the first and second stages, wherein:
the first stage further includes a fifth diode coupled between the first diode and a first leg of the second current mirror; and
the second stage further includes a sixth diode coupled between the fourth diode and a second leg of the second current mirror.

* * * * *